United States Patent [19]

Hayes

[11] Patent Number: 4,692,705
[45] Date of Patent: Sep. 8, 1987

[54] RADIO FREQUENCY FIELD COIL FOR NMR

[75] Inventor: Cecil E. Hayes, Wauwatosa, Wis.

[73] Assignee: General Electric Company, Milwaukee, Wis.

[21] Appl. No.: 565,254

[22] Filed: Dec. 23, 1983

[51] Int. Cl.[4] ............................................. G01R 33/20
[52] U.S. Cl. ..................................... 324/318; 324/322
[58] Field of Search ............... 324/300, 307, 309, 318, 324/319, 320, 321, 322, 313, 316; 343/896; 128/422, 424; 333/220, 225, 219, 227; 335/231, 235, 296, 298, 299

[56] References Cited

U.S. PATENT DOCUMENTS

| | | | |
|---|---|---|---|
| 2,180,855 | 11/1939 | Wundt | 343/896 |
| 2,267,613 | 12/1941 | Lindenblad | 343/896 |
| 2,774,967 | 12/1956 | Lundburg | 343/896 |
| 3,783,419 | 1/1974 | Lafond | 324/300 |
| 3,919,678 | 11/1975 | Penfold | 335/296 |
| 3,953,789 | 4/1976 | Veeman | 324/322 |
| 4,320,342 | 3/1982 | Heinzerling | 324/320 |
| 4,339,718 | 7/1982 | Bull | 324/320 |
| 4,439,733 | 3/1984 | Hinshaw | 324/318 |
| 4,490,675 | 12/1984 | Knuettel et al. | 324/319 |
| 4,506,224 | 3/1985 | Krause | 324/300 |
| 4,573,015 | 2/1986 | Abe et al. | 324/309 |

FOREIGN PATENT DOCUMENTS

| | | | |
|---|---|---|---|
| 0047065 | 3/1982 | European Pat. Off. | |
| 0073375 | 3/1983 | European Pat. Off. | 324/319 |
| 0084946 | 8/1985 | European Pat. Off. | 324/318 |
| 2315498 | 10/1973 | Fed. Rep. of Germany | 336/200 |
| 2755956 | 6/1978 | Fed. Rep. of Germany | 324/313 |
| 3343625 | 5/1985 | Fed. Rep. of Germany | 128/653 |
| 1358352 | 9/1964 | France | |

OTHER PUBLICATIONS

Principles of Electrical Engineering: Theory and Practice: Grover A. Blalock McGraw-Hill Inc., New York, 1950 pp. 85-100.
Journal of Magnetic Resonance 35, No. 3, pp. 329-336 (Sep. 1979) "Simultaneous Multinuclear NMR by Alternate Scan Recording of 31 P and C Spectra;" Styles.
Nuclear Magnetic Resonance Imaging in Medicine-Igaku-Shoin 1981 Leon Kaufmann pp. 62-64.
Journal of Magnetic Resonance 22, No. 1, pp. 165-168 (Apr., 1976) by Assink "A Quadrapole Coil for NMR Spin-Echo Diffusion Measurements as a Function of Pressure".
Rev. Sci. Instrum., vol. 45, No. 10 (Oct., 1974) pp. 1232-1234 Webster "Improved Apparatus for NMR Measurement of Self Diffusion Coefficients . . .".
Journal of Magnetic Resonance No. 3 pp. 481-483 (Mar. 1977) by Matson "NMR Probe Double Tuned Matching Box for Double Resonance FT Exp. on HIFJ".
Rev. Sci. Instrum. vol. 51 No. 7 pp. 887-890 (Jul. 1980) by S. Kan "A Single-Coil Triple Resonance Probe for NMR Experiments".

Primary Examiner—Stewart J. Levy
Assistant Examiner—Scott M. Oldham
Attorney, Agent, or Firm—Mark L. Mollon; Douglas E. Stoner

[57] ABSTRACT

An NMR radio-frequency coil is made up of a plurality of conductive segments evenly spaced about the peripheries and interconnecting a pair of conductive end-cap elements. Each conductive segment includes at least one reactive element which may include a variable capacitive or inductive element.

72 Claims, 23 Drawing Figures

RADIO FREQUENCY FIELD COIL FOR NMR

BACKGROUND OF THE INVENTION

This invention relates to nuclear magnetic resonace (NMR) apparatus. More specifically, this invention relates to radio frequency (RF) coils useful with such apparatus for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate test-tube samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in both humans and animals. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons and/or neutrons. Due to the spin of the protons and neutrons, each such nucleus exhibits a magnetic moment, such that, when a sample composed of such nuclei is placed in a static, homogeneous magnetic field, $B_o$, a greater number of nuclear-magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the Larmor equation $\omega = \gamma B$, in which $\gamma$ is the gyromagnetic ratio (which is constant for each NMR isotope) and wherein B is the magnetic field ($B_o$ plus other fields) acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillating at or near the Larmor frequency. Typically, such magnetic fields designated $B_1$ are applied orthogonal to the direction of magnetization M by means of radio-frequency pulses through a coil connected to radio-frequency-transmitting apparatus. Magnetization M rotates about the direction of the $B_1$ field. In NMR, it is typically desired to apply RF pulses of sufficient magnitude and duration to rotate magnetization M into a plane perpendicular to the direction of the $B_o$ field. This plane is commonly referred to as the transverse plane. Upon cessation of the RF excitation, the nuclear moments rotated into the transverse plane begin to realign with the $B_o$ field by a variety of physical processes. During this realignment process, the nuclear moments emit radio-frequency signals, termed the NMR signals, which are characteristic of the magnetic field and of the particular chemical environment in which the nuclei are situated. The same or a second RF coil may be used to receive the signals emitted from the nuclei. In NMR imaging applications, the NMR signals are observed in the presence of magnetic-field gradients which are utilized to encode spatial information into the NMR signal. This information is later used to reconstruct images of the object studied in a manner well known to those skilled in the art.

In performing NMR studies, it has been found advantageous to increase the strength of the homogeneous magnetic field $B_o$. This is desirable in the case of proton imaging to improve the signal-to-noise ratio of the NMR signals. In the case of spectroscopy, however, this is a necessity, since some of the chemical species studied (e.g., phosphorus and carbon) are relatively scarce in the body, so that a high magnetic field is necessary in order to detect usable signals. As is evident from the Larmor equation, the increase in magnetic field B is accompanied by a corresponding increase in the resonant frequency of the transmitter and receiver coils. This complicates the design of RF coils which are large enough to accommodate large objects such as the human body. One source of difficulty is that the RF field produced by the coil must be homogeneous over the region to be studied. Another complication arises from the intrinsic distributed inductance and capacitance in such large coils which limit the highest frequency at which the coil can be made to resonate.

Presently used coils employ one turn or two turns in parallel to minimize the inductance and increase the resonant frequency. The concentration of the resonant current in so few turns reduces the homogeneity of the $B_1$ field, as well as the homogeneity of the sensitivity to signals produced in different parts of the sample region. Moreover, the lack of symmetry between the position of the tuning capacitor and the stray capacitance of the single-turn coil lead to a non-uniform current distribution in the coil and a corresponding reduction in the uniformity of the $B_1$ field and signal sensitivity.

It is, therefore, an object of the invention to provide an RF coil capable of generating a substantially homogeneous $B_1$ field and which has substantially uniform signal sensitivity over the region of interest.

It is another object of the invention to provide an NMR RF coil which is operable at lower RF power and which exhibits an improved signal-to-noise ratio.

It is still another object of the invention to provide an NMR RF coil having current and tuning capacitance distributed in many turns but which has an effective inductance of a single turn.

SUMMARY OF THE INVENTION

In accordance with the invention, an NMR radio-frequency coil includes a pair of conductive end-cap elements disposed in a spaced-apart relation along a common longitudinal axis. The end-cap elements are electrically interconnected by a plurality of conductive segments each having at least one reactive element in series therewith. The segments are disposed substantially parallel to the common longitudinal axis. In one embodiment, the segments are spaced along the end-cap peripheries such that the resulting configuration has four-fold symmetry. In another embodiment the segments are spaced such that the resulting geometry does not have four-fold symmetry.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

A solenoidal geometry is frequently utilized in the design of magnets which are used to produce the homogeneous magnetic field $B_o$. The use of this geometry imposes two constraints on the design of RF coils to be used in an NMR system. One of these constraints is that the RF coil should be constructed on the surface of a cylinder so there is free access along the axis of the solenoid to accommodate the object to be examined. The other constraint is that the radio-frequency field $B_1$ produced by the RF coil must be homogeneous and perpendicular to the solenoidal axis of symmetry which is parallel to the axis of field $B_o$ (typically selected to be in the Z direction of the Cartesian coordinate system).

Figure 1:
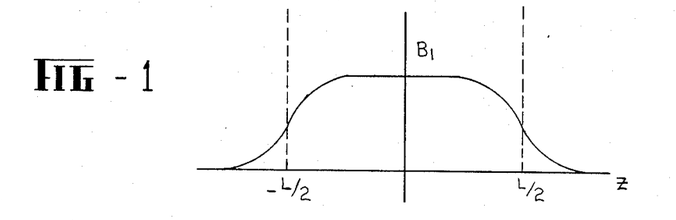
FIG. 1 illustrates graphically the $B_1$ field strength along the Z axis of the coil.

A perfectly uniform $B_1$ RF field can, in principle, be produced in an infinitely long cylinder with a surface current parallel to the cylindrical axis and proportional to sin $\theta$, where $\theta$ is the polar position angle along the circumference of the cylinder. For a coil of finite cylinder length L; however, there will be a decrease in field homogeneity near the end of the coil. This is graphically depicted in FIG. 1 in which the cylindrical-coil axis is coincident with the Z-axis direction shown along the horizontal axis, and in which the $B_1$ field is shown along the vertical axis. It will be observed that field decreases to approximately half its maximum value at the coil ends designated L/2 and −L/2 along the Z axis.

It is possible to construct a short coil which has the uniformity of an infinitely long coil. If an infinite cylinder with the desired sinusoidal surface current distribution is cut by an infinite, conductive sheet perpendicular to the cylinder's axis, the field distribution in one-half of the cylinder is not effected when the other half of the cylinder is deleted. Likewise, a second infinite conductive sheet can be used to cut the semi-infinite cylinder to a finite length without distributing the field distribution in the cylinder between the two parallel infinite sheets. The conductive sheets serve as mirrors for the RF magnetic flux. Induced surface currents proportional to the tangential RF magnetic field at the sheets substitute for the missing infinite length of the cylinder.

A practical coil, however, cannot include two infinite sheets. The preferred embodiment of an RF coil having a finite length and without infinite sheets, but which is capable of generating a highly homogeneous RF field, will be disclosed hereinbelow. It will be, however, instructive to initially consider a coil having conductive end-loop elements rather than conductive end sheets. This is particularly useful since the operation and structure of the coil utilizing conductive loop elements are similar to that of the inventive coil utilizing conductive end-cap elements. Application Ser. No. 548,745, filed in the name of the same inventor as herein and assigned to the same assignee, discloses and claims the RF coil utilizing conductive end-loop elements.

Figure 2A:
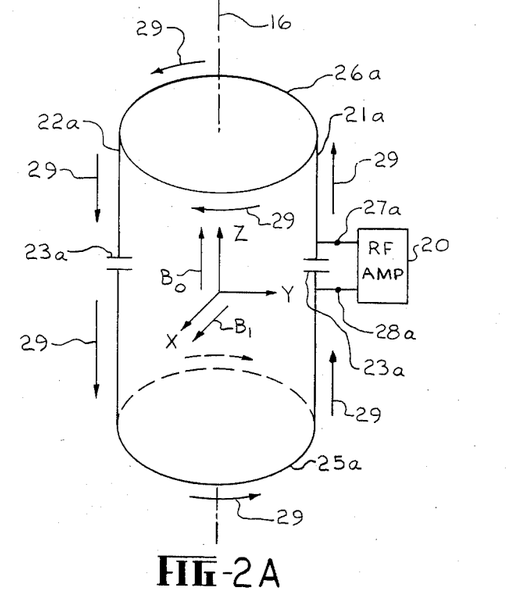
FIG. 2A depicts a single-turn saddle coil which forms the basic element of the coil constructed in accordance with the invention.

Referring now to FIG. 2A, there is shown a single-turn saddle coil comprised of two parallel conductive segments 21a and 22a each having a capacitor 23a connected in series therewith. The ends of conductors 21a and 22a are connected to diametrically opposed points on a pair of parallel conductive loops 25a and 26a spaced apart along common longitudinal axis 16. The coil could be driven by a source such as an RF amplifier generally designated 20 connected between terminals 27a and 28a in parallel with the capacitor in segment 21a. Arrows 29 indicate the relevant current paths which produce a $B_1$ radio-frequency field perpendicular to the plane defined by conductive segment 21a and 22a which, for convenience, will be hereinafter referred to as being vertical. It should be noted that the direction of the $B_1$ field may be determined by the conventional right-hand rule. The rule states that, if the fingers of the right hand are placed around the current-carrying segment so the thumb points in the direction of current flow, the fingers will point in the direction of the magnetic field (i.e., $B_1$).

Figure 2B:
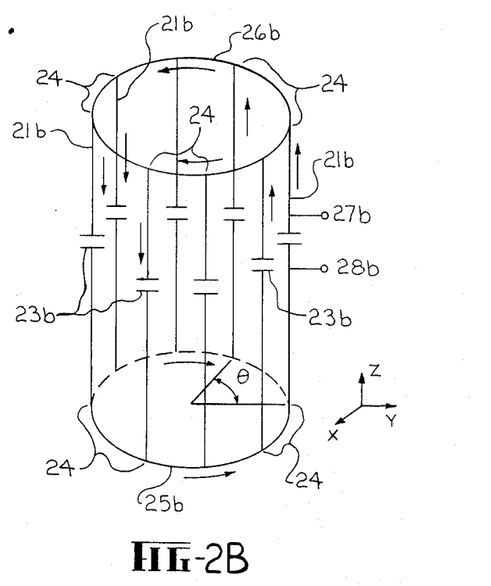
FIG. 2B depicts schematically the inventive NMR RF coil.

The complete NMR coil design, as shown in FIG. 2B, is comprised in the preferred embodiment of a plurality of vertical conductive segments 21b evenly spaced and connected around the upper and lower conductive circular loops 25b and 26b as shown in FIG. 2B. It will be recognized that the loops need not be precisely circular but may also be eliptical or of some other geometrical form generally defining a volume therein to accommodate the object to be examined. Each of the vertical conductive segments includes at least one capacitive element 23b. The multiple current paths, each equivalent to that in FIG. 2A, are indicated by arrows 29 in FIG. 2B, and will be discussed in greater detail hereinafter. The homogeneity of the $B_1$ field increases as the number of vertical conductive segments is increased. This is due to the fact that, as the number of segments is increased, the resultant field is produced by many contributions so that the effect of any one conductor is reduced. The number of conductors cannot be increased without limit since the open spaces between adjacent vertical conductors are needed to allow a path for the magnetic flux, due to current flow, to escape thereby producing a homogeneous $B_1$ field. Coils having 4, 8, 16, and 32 vertical conductors have been constructed. It should be noted that the vertical conductive segments need not be evenly spaced. In fact, an embodiment of the inventive RF coil having a window formed therein to facilitate observation of the patient is disclosed hereinafter. What is needed to produce a homogeneous $B_1$ field is a plurality of vertical conductors distributed around the periphery of the conductive loops such that the current in the vertical conductors approximates a sinusoidal distribution. The resulting NMR coil may be thought of as a resonant cavity made up of a cylinder with an oscillating magnetic field transverse to the cylinder's axis when the coil is excited by a sinusoidal voltage or current source. There are a number of resonant modes possible, as will be more fully described hereinafter.

Figure 3A:
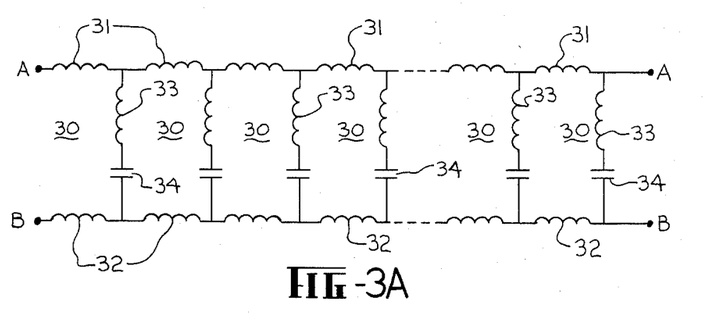
FIG. 3A is a lumped-element equivalent circuit of the inventive NMR RF coil.

A better understanding of the coil depicted schematically in FIG. 2B can be acquired by study of the lumped-element-equivalent circuit for this coil configuration as shown in FIG. 3A. The equivalent circuit is a balanced-ladder network made up of a repeat circuit unit depicted in FIG. 3B and generally designated 30. Each unit is comprised of inductive elements 31 and 32, each having connected at one of the ends thereof a series-connected combination of inductive and capacitive elements 33 and 34, respectively. The two points labelled A (FIG. 3A) are joined together to complete the upper conductive loop 26b, and the points labelled B are joined to complete the lower conductive loop 25b. Inductors 31 and 32 represent the inductance associated with each loop segment 24 along the upper and lower conductive loops of the coil. These inductors are all mutually inductively coupled. Likewise, inductors 33 associated with vertical wire segments 21b are all mutually inductively coupled. To some extent, the vertical segments appear to be connected in parallel with a resulting reduced net inductance compared to the single-turn version shown in FIG. 2A. On the other hand, the mutual coupling increases the net inductance of the upper and lower conducting loops (compared to the sum of the individual self inductances in the loops). In practice, the loop and vertical segment inductances can be minimized by constructing both from a wide band of conducting foil. This may be advantageously accomplished by etching the conductors using a flexible printed circuit board. It may be desirable, for example, to minimize inductances 31, 32, and 33 (FIG. 3A) to raise the operating frequency of the coil.

Figure 3B:
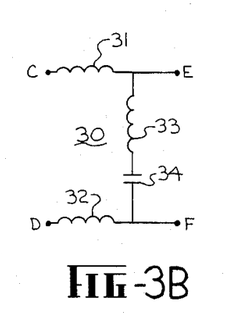
FIG. 3B is a repeat circuit unit, a plurality of which form the circuit shown in FIG. 3A.

Referring now to FIG. 3B, in operation, the voltage between points E and F is phase shifted with respect to the voltage between points C and D. At the frequency where the cumulative phase shift for all units 30 (FIG. 3A) adds to $2\pi$ radians, the coil has a standing wave resonance. At this resonance, referred to as the primary resonance, the current in each vertical wire segment 21b has been found to be approximately proportional to $\sin \theta$, where $\theta$ (see FIG. 2B) is the polar angle of the vertical wire segment measured from the Y axis, for example. Such sinusoidal current distribution produces an increasingly more homogeneous transverse field as the number of vertical wire segments 21b is increased.

The coil configuration represented by the lumped-element equivalent circuit of FIG. 3a can also exhibit higher frequency resonances which produce higher order transverse field distributions. The higher resonance frequencies are excited by using an appropriately higher frequency excitation source. These resonances will be referred to as secondary resonances. For example, when the cumulative phase shift around the network equals $4\pi$ radians, the current in the vertical wire segments is proportional to $\sin 2\theta$. For this resonance, the X and Y components of the transverse field show an approximately linear gradient along the X and Y axes, respectively, with nulls at the center of the coil.

It is not known whether the particular set of equations describing the lumped-element-equivalent network circuit of FIG. 3A has been solved analytically. However, wave propagation in periodic structures has been studied extensively, particularly in solid-state physics, and provides support for the intuitive description of the current distributions in the lumped-element-equivalent circuit. Connecting the ends (A and B, FIG. 3A) of the ladder to produce upper and lower loops imposes periodic boundary conditions which are also often used in crystal lattice theory. For 2N repeat elements 30, there are $2N+1$ loop currents and $2N+1$ linear equations. One loop current can be set equal to zero provided the current in loops 25b and 26b are balanced. The 2N remaining equations can be represented by a $2N \times 2N$ Toeplitz matrix which has N pairs of eigensolutions. The eigen currents are proportional to $\sin n\theta$ and $\cos n\theta$ with $1 \leq n \leq N$. Numerical solutions of the equations indicate that the currents are sinusoidal.

Figure 4:
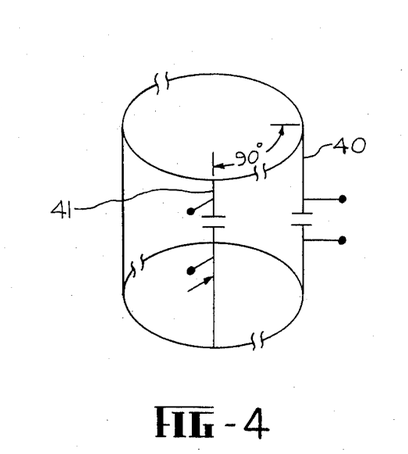
FIG. 4 depicts an embodiment of the inventive NMR RF coil capable of being driven at two points.

Several advantages are realized if the coil is constructed to have four-fold cylindrical symmetry. As used herein, four-fold cylindrical symmetry means that coil geometry (i.e., the position of vertical segments along loop periphery and the capacitive values in each segment) remains the same when the coil is rotated by 90° about its longitudinal axis. For example, coils having a number of vertical segments which is a multiple of four (e.g., 4, 8, 12, 16, 32) have four-fold symmetry. In this case, the primary resonance has two orthogonal degenerate modes at the same resonant frequency. One mode, referred to herein as the X mode, gives an RF magnetic field parallel to the X axis when the current in the vertical wires is proportional to $\sin \theta$. For the other mode, referred to as the Y mode, current is proportional to $\cos \theta$ and the magnetic field is in the Y-axis direction. If the RF coil is driven by applying power from an RF amplifier (not shown) at a single point, such as between terminals 27b and 28b depicted in FIG. 2b, only the X mode is excited. The resonant circuit in this case produces an oscillating RF field $2H_1 \cos \omega t$, which can be thought of as two fields, each $H_1$ in magnitude, rotating in opposite directions in the transverse plane perpendicular to the direction of the $B_o$ field. The nuclei respond to only one of the two rotating fields. Specifically, the nuclei respond to the field rotating in the direction in which the polarized nuclei precess. Hence, the power used to create the $B_1$ component rotating in the wrong direction is wasted. However, if as shown in FIG. 4, the coil is powered at a second drive point in vertical conductor 41 located 90° from the first driving point in vertical conductor 40 with a source 90° out of phase, the two oscillating fields add vectorially to give a single rotating field. In this case, no driving power would be wasted. Hence, driving the inventive RF coil at two driving points separated by 90° doubles the RF power efficiency. Also, because the noise voltages generated in the two orthogonal modes are not correlated but the signals from the nuclei are correlated, the signal-to-noise ratio can be enhanced by a factor of the $\sqrt{2}$. In this case, the detected NMR signal must be sampled at the two orthogonal points of the coil.

The need to maintain orthogonality for the two degenerate X- and Y-resonant modes places constraints on component tolerances and coil geometry. For example, the effective coefficient of inductive coupling, K, between the two modes must be kept small compared to the reciprocal of the coil quality factor Q. At high frequencies, where patient loading of the coil is high and increased RF power efficiency is more desirable, a lower Q of the coil relaxes somewhat the constraints on achieving orthogonality. The two resonance modes are substantially uncoupled if the product K x Q is less than about 5%. In this case, each mode will have the correct phase shift to produce a rotating field.

Figure 5A:
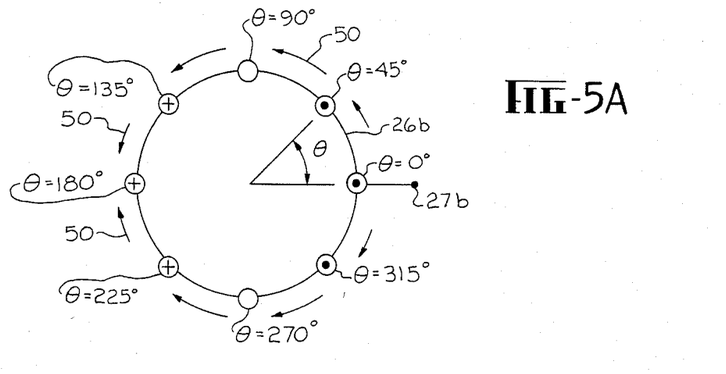
FIG. 5A depicts a top view of an inventive NMR RF coil illustrating current direction in the conductive loop element.
Figure 5B:
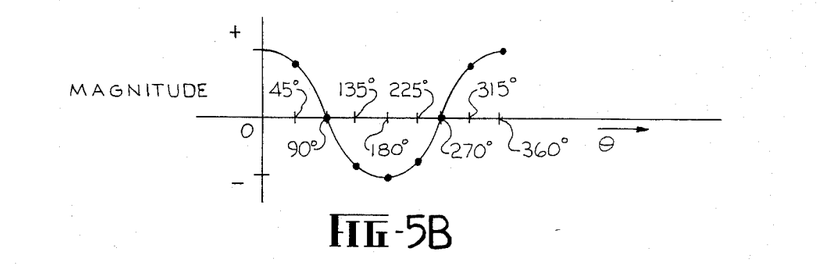
FIG. 5B depicts the sinusoidal current distribution in the vertical segments of the coil depicted in FIG. 5A.
Figures 5C, 5D, 5E:
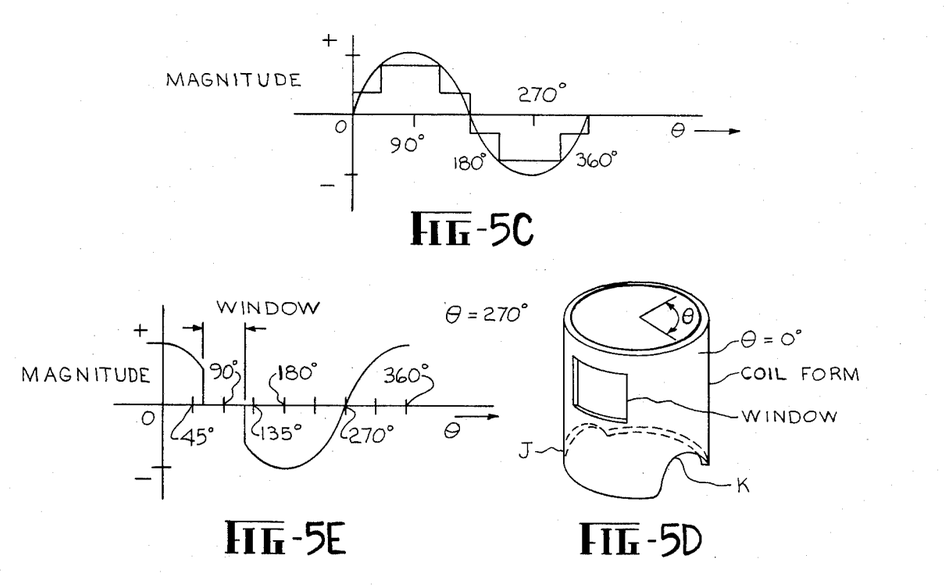
FIG. 5C depicts the current distribution in the conductive loop element of the coil depicted in FIG. 5A.
FIG. 5D illustrates an inventive NMR RF coil having a window formed therein and including a deformed conductive loop lement.
FIG. 5E depicts the current distribution in the vertical segments for the inventive coil depicted in FIG. 5D having some segments removed.

The directions of currents in vertical and loop conductors for a coil having eight vertical conductors, and hence four-fold symmetry, are indicated by arrows 29 in FIG. 2B which depicts such a coil. The current directions are for the primary (desired) resonance mode. The sinusoidal nature of these currents will now be discussed in greater detail with reference to FIGS. 5A-5C. Referring now to FIG. 5A, there is shown a top view of the coil depicted in FIG. 2B. The coil is energized at points 27b and 28b, as before, which are in a segment arbitrarily assigned to a position $\theta = 0°$. With the coil energized in this manner, the maximum current proportional to $\cos \theta$ flows in the segment located at 0° in a direction out of the paper plane as suggested by the circled dot. Smaller currents (proportional to $\cos \theta$, wherein $\theta = 45°$ and 315°) flow in the same direction in the segments adjacent the one situated at 0°. Currents of corresponding magnitude flow in an opposite direction (into the paper, as indicated by the circled cross) in the segments situated at 180°, 135°, and 225°. The magnitude of current flow in the conductive segments is graphically depicted in FIG. 5B, in which position angle $\theta$ is indicated along the horizontal axis, while current magnitude is indicated along the vertical axis. Currents flowing out of the paper (45°, 0°, 315°) have been arbitrarily designated as having positive values, while those flowing into the paper (135°, 180°, 225°) have negative values. In the primary resonant mode, the segments at 90° and 270° do not conduct any current and in practice may be eliminated or replaced by short circuits.

The direction of current flow in upper conductive loop 26b (FIG. 5A) is indicated by arrows 50 which are sized relative to one another to indicate approximate magnitudes. More precisely, loop current distribution is graphically depicted in FIG. 5C with angular position and current magnitude being indicated along horizontal and vertical axes, respectively, and wherein clockwise current flow is arbitrarily assigned to have a positive value. The loop currents are distributed in a step-wise manner. Thus, currents flowing between 45° and 90°, and between 315° and 270° are larger than those between 0° and 45°, and between 0° and 315°, respectively, since the former include currents provided by segments at 45° and 315°.

In some coil embodiments (FIG. 5D), particularly those used for NMR imaging of the head, it has been found advantageous to cut a window in the coil form to provide ready means for the patient face to be visible. This has necessitated the removal of some of the vertical segments to provide an unobstructed area in which to cut the window. This is especially true of coils having closely spaced vertical segments, such as the 32 segments in an embodiment disclosed hereinafter. To minimize the perturbation of RF field homogeneity, it has been found desirable to remove those segments which carry little or no current. In the embodiment shown in FIG. 5A, either one of the conductors situated at 90° or 270° could be removed without significantly affecting field homogeneity. The current distribution in the vertical segments in the case where the segment at 90° is removed is graphically in FIG. 5E. The current magnitude at points greater than 45° and less than 135° is zero.

In the embodiment having 32 vertical segments, six segments were removed to accommodate the window. The coil was found to work satisfactorily without any adjustment. In the preferred embodiment, however, it has proven advantageous to increase the capacitance values in the segments nearest the window on either side to accommodate increased currents therein to compensate for the eliminated current-carrying capacity of the removed segments.

Figure 6A:
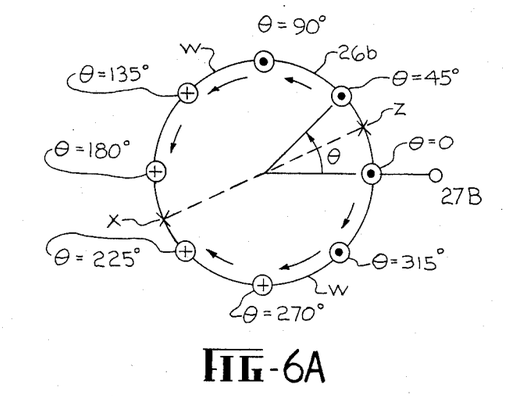
FIGS. 6A–6C are similar to FIGS. 5A, 5B, and 5C, respectively, and depict an inventive NMR RF coil, and currents associated therewith, having open circuits formed in the loop elements thereof.
Figure 6B:
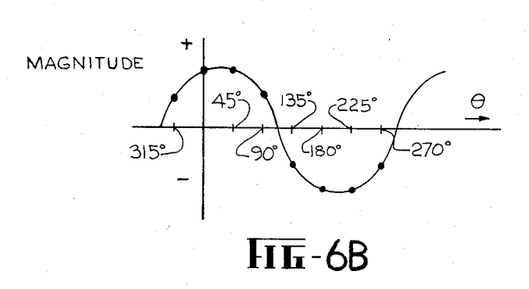
Figure 6C:
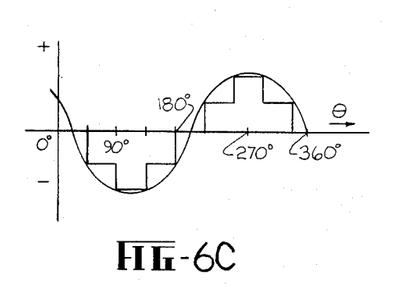

It has also been found advantageous in the case of NMR head coils to fabricate the inventive coil on two separable coil assemblies as claimed and disclosed in commonly assigned co-pending application Ser. No. 551,626 which is incorporated herein by reference as background material. In this case, it is necessary to form open circuits in the upper and lower loop conductors at points X and Z as indicated in FIG. 6A. The coil is still energized at a segment located at 0° such that in operation the two coil halves resulting from the open circuits are coupled by mutual inductance to operate as a single coil. FIG. 6A is similar to FIG. 5A, with the exceptions that, due to the loop open circuits, segments at 90° and 270° carry oppositely directed currents. The segment current distribution for this embodiment is depicted in FIG. 6B, and, as before, has a sinusoidal geometry dependent on angle $\theta$ with maximum current occurring in segments near 0°, 45°, 180°, and 225°. FIG. 6C depicts the current distribution in the conductive loop elements. Maximum loop current values occur at values of $\theta$ slightly greater than 90° and 270° at points designated W.

If desired, a window may be formed in the coil embodiment depicted in FIG. 6A, by removing conductive segments carrying the lowest currents. Such segments are located between 90° and 135°, and 270° and 315° as indicated by regions designated W in FIG. 6A. Reference to FIG. 6B will indicate that these regions correspond to segments having the lowest currents and, therefore, would have the least impact on RF field homogeneity.

If the coil geometry (i.e., either the location of vertical segments along the loop periphery or the capacitance values of the capacitors in each segment) is selected to have other than four-fold symmetry, the X- and Y-resonant modes are orthogonal and occur at different frequencies. One method of exciting the two resonances is with two sources, as described hereinbefore. It is, however, possible to excite two resonances using a single source having the needed frequency components. Small variations in component value or coil geometry may give two overlapping resonances if the coil Q is high enough. This may be troublesome if only a single resonance is desired. One of the two resonances may be sufficiently displaced, however, in frequency to render it harmless if the coil symmetry is grossly perturbed. One possibility is to cut the upper and lower conductive loops 25b and 26b (FIG. 2B) at the points where the desired mode has current nulls. Another possibility is to replace those capacitors 23b which carry no current in the desired mode by short or open circuits. A short-circuited segment in effect appears as a large capacitance and therefore tends to lower the resonant frequency of the undesired mode. The effect of an open circuit is to decrease the apparent capacitance to thereby increase the resonant frequency.

It may be advantageous in the non-four-fold symmetrical coil to manipulate the two resonant frequencies by proper choice of capacitors 23b. The X mode has maximum currents where the Y mode has minimum current. Hence, by increasing the capacitor values where $\sin \theta$ is large and decreasing the capacitors where $\cos \theta$ is large, the X-mode frequency can be lowered and the Y-mode frequency raised. Such a coil would be useful for performing simultaneous NMR double resonance studies. For example, one mode could be tuned for the proton $^1H$ resonance and the other mode for the fluorine $^{19}F$ resonance.

There are a number of ways that the NMR coil design in principle can be implemented for NMR studies. In the preferred embodiment, the conductive elements (e.g., 21b, 25b and 26b, FIG. 2B) are constructed with wide sheets of conductive foil in order to minimize their self inductance. They also could be constructed with large diameter conductive tubing, for example.

If a coil is required to resonate at a single predetermined frequency, it is possible to construct a coil patterned after FIG. 2B using only fixed capacitors. It is, however, more practical to include some variable elements for fine tuning the resonant frequency. The minimum requirement for tuning both X and Y modes is to place a variable trimming capacitor in each of two vertical conductive elements located 90° apart (e.g., 40 and 41, FIG. 4). Small perturbations on the capacitance at these two points will not greatly disturb the field homogeneity. Where a wider adjustment of resonant frequency is desired, it is preferable to tune all of the capacitors simultaneously or to change the effective inductance of the coil assembly. Small variations in inductance can be achieved by varying the width of foil-conductive elements. Larger variations in inductance can be achieved by varying the lengths of the vertical conductors by adjusting the distance between the two conductive loops.

The manner in which a coil having 32 segments and which was physically and electrically sized for NMR head studies will now be described with reference to FIGS. 7A and 7B. The same construction method is utilized in the construction of body coils which are typically sized to have a larger diameter. The head coil was operable at a frequency of 21.31 MHz, which is determined by the strength of main field $B_o$ and the NMR isotope studied. In general, the coil is fabricated by etching (using conventional techniques) four double-sided copper-clad Teflon resin printed circuit boards. The boards are mounted on a cylindrical form having a 10.5 inch outside diameter. Each side of the circuit boards is etched with a different conductive pattern. Each circuit board is approximately 8 by 12 inches. It will be recognized that the coil could also be constructed by etching the needed conductive patterns on a single printed circuit board.

Figure 7A:
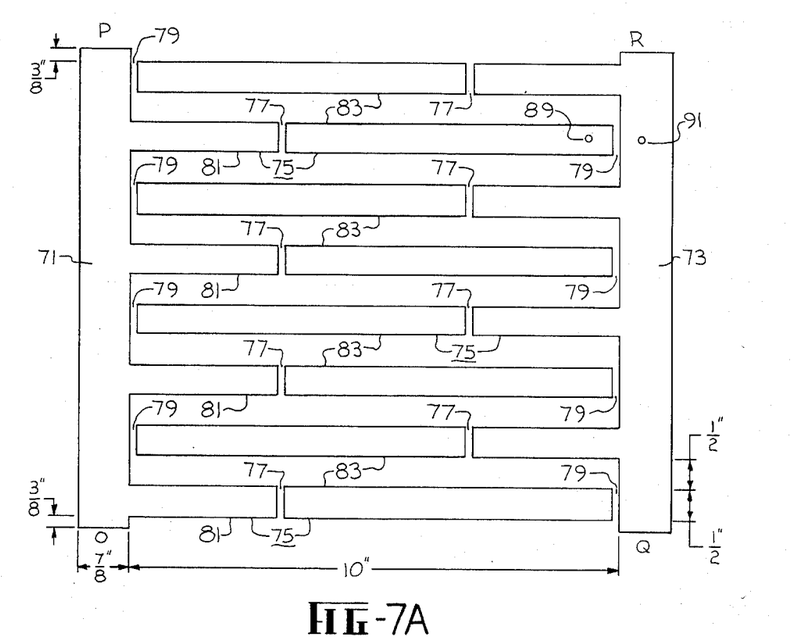
FIGS. 7A and 7B depict conductive patterns utilized in fabricating the preferred embodiment of the inventive NMR RF coil.

Referring now to FIG. 7A there is shown the conductive pattern utilized for etching the side of the circuit board (referred to hereinafter as the inside etched surface) which is mounted on the cylindrical form and which is closest to the NMR sample positioned in the coil. Wide strips 71 and 73, each seven-eighths inch wide, form one-fourth of the length of the conductive loop elements. There are eight straight conductive elements, generally designated 75, each approximately ten inches long and one-half inch wide, extending between loop elements 71 and 73. The straight elements are separated by one-half inch wide blank areas where the copper is to be etched away. The straight elements are offset from the ends of loop elements 71 and 73 by approximately three-eighths inch. Adjacent ones of straight elements 75 have a gap 77 formed therein to leave, alternately, one-third (designated 81) of the element connected to loop elements 71 and 73. A second gap 79 is provided in each straight element to separate the remaining two-thirds (designated 83) of the straight element from the corresponding loop element. In this manner, a pattern is formed in which each straight element is made up of a connected one-third of the element and an unconnected two-thirds of the element. In adjacent straight conductors, the unconnected element 83 is coextensive with the connected one third and extends beyond gap 77 to be coextensive with a one-third of the unconnected element in the adjacent straight conductor.

Figure 7B:
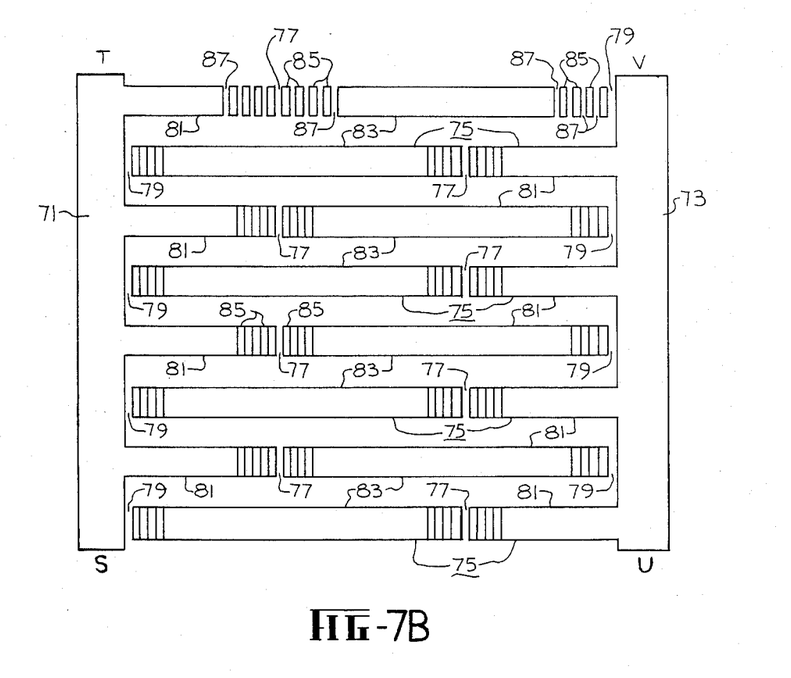

The other pattern is depicted in FIG. 7B and will be referred to herein as the outside etched surface. This pattern is a mirror image of the pattern depicted in FIG. 7A and is sized to have the same dimensions. The pattern of FIG. 7B differs from that of FIG. 7A in that straight conductor portions 81 and 83 are each provided with typically four (although more or fewer could be used) copper pads 85 by etching narrow gaps 87.

The inner and outer etched surfaces are overlayed such that points S, T, U, V (FIG. 7A) lie above points O, P, Q, R (FIG. 7B), respectively. In this manner, gaps 77 on each etched (inner and outer) surface are bridged by continuous portions of the unconnected two-thirds 83 of the straight elements 75 on each surface. Gaps 79 are bridged by continuous portions 81 of the straight element. The combination of cooper foil segments and printed circuit dielectric form three series-connected capacitors along the length of each straight conductor. The number of capacitors can be varied by increasing or decreasing the number of gaps. The net capacitance in each straight conductor is typically adjusted to be approximately equal. The adjustment is accomplished by electrically connecting to conductors 81 or 83 (FIG. 7B) one or more of copper pads 85 by bridging gaps 87 to change the area of overlap of the inner and outer surfaces. In the preferred embodiment, the inner and outer patterns are etched on opposite sides of a double-sided printed circuit board.

Strips 71 and 73 on each of the inner and outer etched surfaces are electrically connected together at points O and S, P and T, Q and U, and R and V to form one quarter assembly. A complete coil requires four such overlayed and interconnected assemblies. A half of the coil is made by electrically joining two quarter assemblies. Points O and Q of one quarter assembly are electrically connected to points P and R, respectively, of the second quarter assembly. The two coil halves constructed in this manner are mounted on a cylindrical coil form without electrical connections between them. Leaving the two halves of the loop conductors disconnected splits the degeneracy of the two desired resonances, as disclosed hereinbefore. The two coil halves are coupled, in operation, by the mutual inductances thereof when one of the halves is energized across one or more of the three series-connected capacitors in a straight conductor, such as, for example, at points 89 and 91 shown in FIG. 7A. The drive point impedance was about 50 ohms without any adjustment with a patient's head positioned in the coil (i.e., with a loaded coil). The coil impedance can be adjusted by selecting the drive point to be across more than one of the series-connected capacitors.

In the preferred embodiment, the double-sided printed circuit board dielectric (Teflon resin) thickness was about 0.006″. Each of the three capacitors in each straight conductor was adjusted to equal approximately 133 pico farads. It should be noted that it is not important that each capacitor have equal value, but only that the net capacitances of each straight conductor are equal. The desired resonance frequency with a homogeneous RF magnetic field was at 21.31 MHz.

Another embodiment of the NMR coil was constructed following the patterns disclosed with reference to FIGS. 7A and 7B and having 32 vertical segments. This coil was constructed on a cylindrical form having an outside diameter of 11.5 inches and a length of 16.5 inches. Strip elements 71 and 73 (FIGS. 7A and 7B) were 0.25 of an inch wide. Straight conductors 75 were 0.5 of an inch wide spaced at five-eighths inch intervals. In this case, there were ten gaps in each straight conductor, similar to gaps 77 and 79, so that the value of each series-connected capacitor was lower than that in the embodiment of FIGS. 7A and 7B. The coil resonant frequency was 63.86 MHz.

It will be, of course, realized that the above-disclosed construction is merely the preferred embodiment, and that in fact there are other methods of construction which may be advantageously employed by persons skilled in the art.

Figure 8:
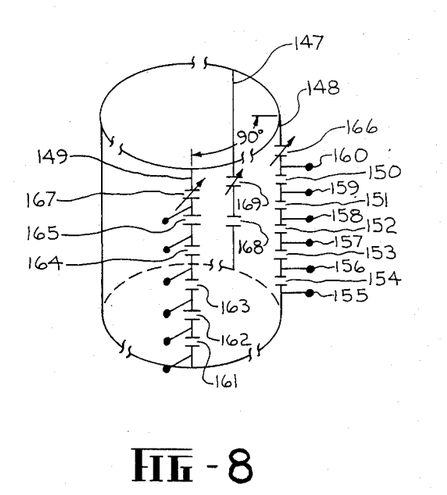
FIG. 8 is a partial schematic illustration of the inventive NMR RF coil in which selected ones of the vertical wires are provided with a plurality of fixed capacitors which may be utilized for impedance matching.

It will also be recognized that it is desirable for efficient power transfer to have matching coil input and transmitter output impedance. In the inventive NMR coil configuration, this may be accomplished by providing a plurality of series-connected capacitances, such as capacitances 150–154, in a vertical conductor 148, as shown in FIG. 8. In this case, an appropriate pair of terminals 155–160 providing the desired impedance is selected as needed to provide the best match to the transmitter impedance. When two driving points are used to energize the coil, similar series capacitances 161–165 may be utilized in the second vertical conductor 149 which is perpendicular to the first driven conductor. In this case, variable capacitances 166 and 167 in conductors 148 and 149, respectively, are utilized to fine tune the coil. In those vertical conductors which are not used as driving points, the capacitance needed to resonate the circuit need not be distributed in a string of series-connected capacitors, but may instead be lumped into a single capacitance 168 shown in FIG. 8 as being connected in a vertical conductor 147, which may also include a variable tuning capacitor 169. As in the case of FIG. 4, some of the vertical conductors in FIG. 8 are not shown to preserve clarity.

Figure 9:
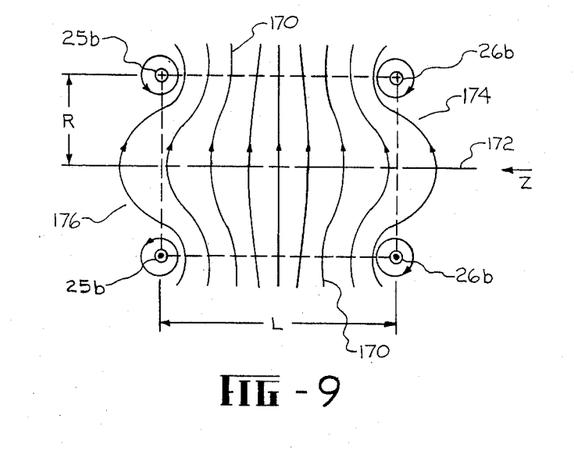
FIG. 9 is a plot of radio frequency field flux lines on a plane through the longitudinal axis of the coil.

The coil disclosed hereinabove performs well in head and body imaging applications. As noted before, however, with reference to FIG. 1, the strength of the $B_1$ field drops off in the Z-axis direction at the ends of the coil. This is shown in FIG. 9 which is a plot of the flux lines 170 on a plane through cylindrical axis 172 of the coil parallel to the RF field. The plane is taken through the points in the conductive loops having maximum current, such as through the dashed line between points W—W in FIG. 6A. The field flux lines tend to bulge out at open ends 174 and 176 of the coil. The field flux is also rearranged by the current in the end rings which are required to conduct current from one side of the coil to the other. The region of inhomogeneity extends into the coil from the ends for a distance of approximately one radius "R" of the cylinder. Hence, for a coil two or three radii in length, the region of homogeneity is short.

The region of homogeneity can be enlarged in accordance with the invention without resorting to infinite end sheets. The boundary conditions for a uniform field within the cylinder (which in NMR studies is the region of interest) require only two conductive end-cap elements sealing the ends of the cylinder. The end caps provide the conductive return path that permits a closed loop for the sinusoidal surface current on the cylinder. The currents are distributed uniformly on the inner cap surface instead of being concentrated on the conductive loop elements 25b and 26b (FIG. 2B). The end caps also reduce the net inductance of the coil assembly by decreasing the effective inductance (31 of FIG. 3A) of the conductive loop elements. The sinusoidal current distributions on the cylindrical surface are approximated by the vertical conductive segments as disclosed hereinbefore. A coil having two end caps is not practical for NMR studies of the human body or head. Such a coil is, however, useful for imaging small animals and studies of tissue samples where the sample material can be enclosed at both ends.

Figure 10:
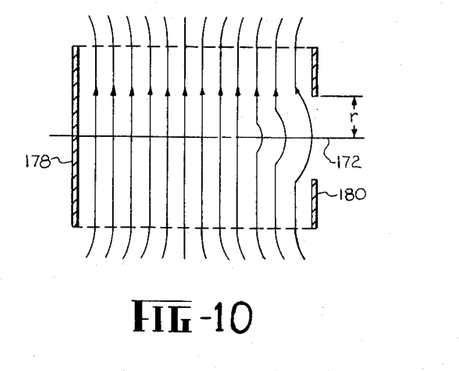
FIG. 10 depicts one embodiment of the inventive NMR RF coil utilizing conductive end-cap elements to improve the homogeneity of the RF field.

FIG. 10 illustrates a cross-sectional view of a coil (similar to that disclosed with reference to FIG. 2B) taken along a plane parallel to the RF field, as in FIG. 9. In this case, only a single, complete end cap 178 which operates as a reflector to prevent bulging of the flux lines is provided. As is evident in FIG. 10, flux lines near the cap are substantially parallel to those near the center of the coil thereby increasing the length of the homogeneous region. A similar end cap could be utilized at the other end of the coil. However, if a complete closure of an end is not desired, an annular end cap 180 having a opening of radius "r" may be utilized to partially reduce the bulge of flux lines at one end of the coil. In this case, the region of inhomogeneity extends into the coil for a distance of approximately one radius r of the hole in end cap 180, thereby realizing partial benefit of a complete end cap. A coil having one complete and one partial cap could be used for NMR studies of the head, or other applications requiring a larger access opening than is afforded by the space between the vertical conductors in a coil with two full end caps. It will be recognized that one or both end caps could be made of perforated conductive material. Many small holes would create only short-ranged field inhomogeneities. Additionally, if the annular diameter r is made sufficiently large, the annulus becomes a conductive loop element, such as elements 25b and 26b (FIG. 2B).

In one embodiment of the invention, end-cap elements 178 and 180 (FIG. 10) are electrically connected to the conductive end loops 25b and 26b (FIG. 2B). The end loops are formed by overlaying the inner and outer etched surfaces (FIGS. 7A and 7B), as before, and electrically interconnecting strips 71 along the entire lengths thereof. Strips 73 are interconnected in a similar manner. The end-cap elements are then electrically connected along their entire length to respective ones of the strips 71 and 73. In the preferred embodiment, the end-cap elements are connected to the regions of strips 71 and 73 nearest gaps 79 (FIGS. 7A and 7B).

In an alternative embodiment, at least one of the conductive end-cap elements could be made to be removable. This could be accomplished, for example, by providing screw threads (not shown) on the end cap and the vertical conductive segments. Such an arrangement would be useful in adjusting the coil resonant frequency by changing the effective length of the cylinder. In this manner, decreasing the length of the vertical conductors would raise the resonant frequency. Conversely, lengthening the conductive segments would lower the resonant frequency.

Figure 13:
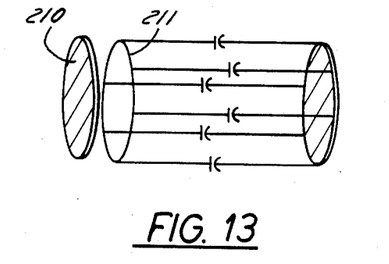
FIG. 13 depicts another embodiment of the conductive end-cap elements.

In still another embodiment, shown in FIG. 13, one of the conductive end-cap elements 210 could be electrically isolated from the conductive loop element 211. The end cap would still operate to prevent the flux from bulging out at the coil end, but with increased losses.

Figure 11:
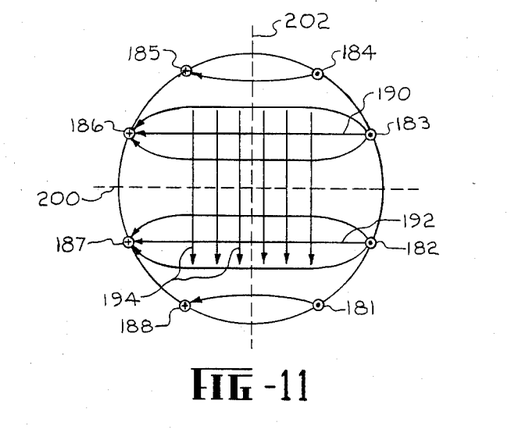
FIG. 11 depicts current flow in a conductive end-cap element.

The current distribution in a complete end cap is shown in FIG. 11 for a coil embodiment having 8 vertical conductive segments 181–187. The dotted circles in vertical conductors 181–184 represent current flow out of the figure plane, while the crossed circles in conductors 185–188 indicate current flow into the plane of the figure. In a cylindrical coil having sinusoidal surface current flow, the currents in the end cap would be parallel to one another and perpendicular to the direction of the $B_1$ field. In the embodiment shown in FIG. 11, surface current flow is primarily between conductor pairs 182 and 187, and 183 and 186. Current flow is centered about parallel current paths indicated by arrows 190 and 192. Current flow in the central region of the end cap is substantially parallel to arrows 190 and 192. The $B_1$ field designated by parallel arrows 194 is perpendicular to the direction of current flow. The current paths between conductor pairs 181 and 188, and 184 and 185 are somewhat distorted. The distortion in the current flow results in a correspondingly distorted $B_1$ field having the best uniformity near the coil center where current paths are most parallel. As the number of vertical conductors increases, the current paths become increasingly more parallel improving the homogeneity of the $B_1$ field. A two-piece coil may be constructed by cutting the end plates in a direction parallel to the current flow. This may be most advantageously achieved, in the embodiment depicted in FIG. 1, by a cut across the plate between vertical segment pairs 182-183 and 186-187, as exemplified by dashed line 200. It should be noted that such a cut has a similar effect on current distribution in the vertical segments as disclosed hereinabove with reference to FIG. 6A.

Figure 12A:
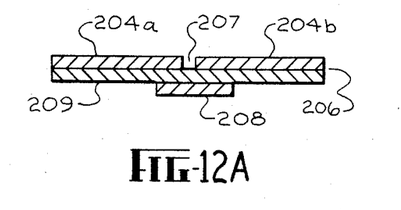
FIGS. 12A and 12B are cross-sectional views of the conductive end-cap elements having uniform capacitors formed therein in accordance with the invention.

One or both of the conductive end-cap elements can be provided with a uniform capacitive element across a cut perpendicular to the flow of current, as suggested by dashed line 202 in FIG. 11. One way in which such a capacitor could be constructed is shown in FIG. 12A which depicts a cross-sectional view of a cap taken perpendicular to cut 202. The end cap is comprised of two semi-circular conductive patterns 204a and 204b etched on one side of a double-sided printed circuit board 206 and separated by a gap 207. A conductive strip 208 bridging gap 207 is etched on the other side of the printed circuit board. Since a high dielectric substrate 209 (preferably Teflon resin) separates the conductive patterns, a capacitor having uniform (constant) capacitance per unit length is formed along gap 207. The capacitive element can be used to vary the coil resonant frequency. The coil may also be energized across the capacitive element by connecting an RF power source to strip 208 and at least one of end-cap halves 204a or 204b.

Figure 12B:
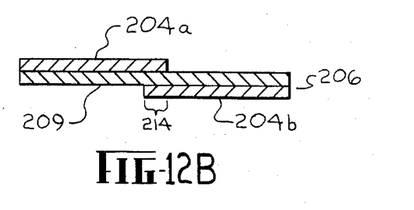

FIG. 12B illustrates another configuration for constructing the uniform capacitor. In this case, one-half 204a of the conductive end cap is etched on one side of substrate 209, which half 204b is etched on the other. The two halves are sized so as to create an overlap region 214 to create the uniform capacitor. Overlap region 214 is congruent with dashed line 202 in FIG. 11. The coil could be energized by connecting an RF power source acros the capacitor.

From the foregoing, it will be appreciated that, in accordance with the invention, an NMR RF coil is provided in which the current and tuning capacitance are distributed in many turns, but in which the effective inductance is approximately equal to or less than that of a single-turn coil. The inventive NMR RF coil also provides a considerable improvement in the uniformity of the $B_1$ field and in signal sensitivity. The coil's geometry also permits improvements in signal-to-noise ratio and reduction in RF driving power.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:
1. An NMR radio-frequency (RF) coil comprising:
   a pair of conductive end-cap elements disposed in a spaced-apart relation along a common longitudinal axis; and
   a plurality of conductive segments each having at least one reactive element in series therewith, said segments electrically interconnecting said end-cap elements at points spaced along the periphery of each of said end-caps, said segments being disposed substantially parallel to said longitudinal axis such that the resulting configuration has four-fold symmetry.

2. The NMR RF coil of claim 1 wherein each of said end-cap elements is substantially circular and said conductive segments are spaced at equal intervals along the periphery of each of said end caps.

3. The NMR RF coil of claim 1 wherein said reactive element comprises at least one capacitive element.

4. The NMR RF coil of claim 3 wherein said coil is energizable across at least one of said capacitive elements in one of said conductive segments to achieve in operation a current in said segments approximating a sinusoidal distribution dependent on the segment angular position $\theta$ along the end-cap peripheries.

5. The NMR RF coil of claim 1 or 4 wherein at least one of said end caps has a plurality of apertures formed therein, each aperture having a relatively small area compared to the area of said end caps.

6. The NMR RF coil of claim 1 or 4 wherein each of said end caps comprises two conductive halves separated by a non-conductive region, which region is oriented substantially parallel to the direction of current flow in said end caps.

7. The NMR RF coil of claim 4 wherein said capacitive elements in segments positioned along the end-cap peripheries where said sinusoidal current distribution approximates a minimum magnitude comprise a short circuit.

8. The NMR RF coil of claim 4 wherein said capacitive elements in segments positioned along the end-cap peripheries where said sinusoidal current distribution approximates a minimum magnitude comprise an open circuit.

9. The NMR RF coil of claim 8 wherein one of said end-cap elements comprises an annulus.

10. The NMR RF coil of claim 9 wherein said coil comprises a head coil and wherein said conductive end cap and segments are mounted on a substantially cylindrical coil form, which form is provided with a window in the region where said segments have been replaced by open circuits.

11. The NMR RF coil of claim 3 wherein said coil is energizable by a first source connected in parallel with one of said capacitive elements in a first one of said segments so as to excite said RF coil to produce an oscillating RF field perpendicular to said longitudinal axis and described by $2H_1$, cos $\omega t$, in which $2H_1$ is the magnitude of the oscillating RF field,
$\omega$ is the resonant frequency of the RF field,
t is time,
said RF field being made up of two components rotating in opposite directions.

12. The NMR RF coil of claim 11 wherein said coil is energizable by a second source 90° out of phase with said first source, said second source being connected in parallel with a capacitive element in a second one, of said segments separated by an angle $\theta = 90°$ from said first segment such that said orthogonal RF field components add vectorially to produce a single rotating RF field, wherein $\theta$ is a polar angle indicative of the position of each of said segments along the periphery of said loops.

13. The RF coil of claim 12 wherein at least one of said first and second segments includes a plurality of series-connected capacitive elements, the common points between said series-connected capacitive elements being selectable to adjust the input impedance of said coil.

14. The RF coil of claim 11 wherein said first segment includes a plurality of series-connected capacitive elements, the common points between said series-connected capacitive elements being selectable to adjust the input impedance of said coil.

15. The NMR RF coil of claim 3 wherein at least one of said segments includes at least one variable capacitive element.

16. The NMR RF coil of claim 1 or 4 wherein at least one of said end-cap elements includes a capacitive element having a constant capacitance per unit length in a direction substantially orthogonal to the direction of current flow in said end cap.

17. The NMR RF coil of claim 16 further comprising means for energizing said RF coil across said capacitive element having a constant capacitance per unit length.

18. The NMR RF coil of claim 1 or 4 further comprising at least one conductive loop element spaced apart from one of said end-cap elements above, along a common longitudinal axis, said conductive segments electrically interconnecting the one of said end-cap elements and said loop element, the other one of said end-cap elements being substantially coplanar with and having a common center point with said loop element but being electrically insulated therefrom.

19. An NMR radio-frequency (RF) coil comprising:
a pair of conductive end-cap elements disposed in a spaced-apart relation along a common longitudinal axis; and
a plurality of conductive segments each having at least one reactive element in series therewith, said segments electrically interconnecting said end-cap elements at points spaced along the periphery of each of said end caps, said segments being disposed substantially parallel to said longitudinal axis resulting in a configuration having non-four-fold symmetry.

20. The NMR RF coil of claim 19 wherein each of said end-cap element is substantially circular and said conductive segments are spaced at equal intervals along the periphery of each of said end-cap elements.

21. The NMR RF coil of claim 19 wherein said reactive element comprises at least one capacitive element.

22. The NMR RF coil of claim 21 including means allowing said coil to be energized across at least one of said capacitive elements in one of said conductive segments to achieve in operation a current in said segments approximating a sinusoidal distribution dependent on the segment angular position $\theta$ along the end-cap peripheries.

23. The NMR RF coil of claim 19 or 22 wherein at least one of said end caps has a plurality of apertures formed therein, each aperture having a relatively small area compared to the area of said end caps.

24. The NMR RF coil of claim 19 or 22 wherein each of said end caps comprises two conductive halves separated by a non-conductive region, which region is oriented substantially parallel to the direction of current flow in said end caps.

25. The NMR RF coil of claim 22 wherein said means includes first and second means allowing said RF coil to be energized so as to excite therein first and second orthogonal resonant modes having segment current distributions proportional to sin $\theta$ and cos $\theta$, respectively, said capacitive elements in segments where sin $\theta$ is large having high capacitive values, while said capacitive elements in segments where cos $\theta$ is large having lower capacitive values relative to said high values such that said first and second modes occur at different frequencies.

26. The NMR RF coil of claim 22 including mans allowing said RF coil to be energized so as to excite therein first and second orthogonal resonant modes, one of said modes being a desired mode, said capacitive elements in segments carrying negligible current in the desired mode being replaced by short circuits so as to displace the frequency of the undesired mode relative to the frequency of the desired mode.

27. The NMR RF coil of claim 22 including means allowing said RF coil to be energized so-as-to excite therein first and second orthogonal resonant modes, one of said modes being a desired mode, said capacitive elements in segments carrying negligible current in the desired mode being replaced by open circuits so as to displace the frequency of the undesired mode relative to the frequency of the desired mode.

28. The NMR RF coil of claim 27 wherein at least one of said end-cap elements comprises an annulus.

29. The NMR RF coil of claim 22 wherein said means comprises first and second means disposed on first and second segments, respectively, separated by an angle $\theta = 90°$.

30. The NMR RF coil of claim 29 wherein at least one of said first and second means each comprise a plurality of series-connected capacitive elements, the common points between said series-connected capacitive elements being selectable to adjust the input impedance of said RF coil.

31. The NMR RF coil of claim 22 wherein said means comprises a plurality of series-connected capacitive elements, the common points between said series-connected capacitive elements being selectable to adjust the input impedance of said RF coil.

32. The NMR RF coil of claim 19 wherein at least one of said segments includes at least one variable capacitive element.

33. The NMR RF coil of claim 19 or 22 wherein at least one of said end-cap elements includes a capacitive element having a constant capacitance per unit length in a direction substantially orthogonal to the direction of current flow in said end cap.

34. The NMR RF coil of claim 33 further comprising means for energizing said RF coil across said capactive element having a constant capacitance per unit length.

35. The NMR RF coil of claim 19 or 22 further comprising at least one conductive loop element spaced apart from one of said end-cap elements above, a common longitudinal axis said conductive segments electrically interconnecting the one of said end-cap elements and said loop element, the other one of said end-cap elements being substantially coplanar with and having a common center point with said loop element but being electrically insulated therefrom.

36. An NMR radio-frequency (RF) coil comprising:
a pair of conductive end-cap elements disposed in a spaced-apart relation along a common longitudinal axis; and
a plurality of conductive segments each having at least one reactive element associated therewith, said segments electrically interconnecting said end-cap elements at points spaced along the periphery of each of said end-cap elements, said RF coil having means for being energized to achieve in operation, an approximately sinusoidal current distribution in said segments, said distribution being dependent on the angular position $\theta$ of each of said segments along the end-cap peripheries.

37. The NMR RF coil of claim 36 wherein each of said end-cap elements is substantially circular and wherein said conductive segments are spaced at equal intervals along the periphery of each of said end-caps.

38. The NMR RF coil of claim 36 wherein said reactive element comprises at least one capacitive element.

39. The NMR RF coil of claim 36 or 38 wherein at least one of said end caps has a plurality of apertures formed therein, each aperture having a relatively small area comprised to the area of said end caps.

40. The NMR RF coil of claim 36 or 38 wherein each of said end caps comprises two conductive halves separated by a non-conductive region, which region is oriented substantially parallel to the direction of current flow in said end caps.

41. The NMR RF coil of claim 38 wherein said means includes first and second means allowing said RF coil to be energized so as to excite therein first and second orthogonal resonant modes having segment current distributions proportional to $\sin \theta$ and $\cos \theta$, respectively, said capacitive elements in segments where $\sin \theta$ is large having high capacitive values, while said capacitive elements in segments where $\cos \theta$ is large having lower capacitive values relative to said high values such that said first and second modes occur at different frequencies.

42. The NMR RF coil of claim 38 including means allowing said RF coil to be energized so as to excite therein first and second orthogonal resonant modes, one of said modes being a desired mode, said capacitive elements in segments carrying negligible current in the desired mode being replaced by short circuits so as to displace the frequency of the undesired mode relative to the frequency of the desired mode.

43. The NMR RF coil of claim 36 including means allowing said RF coil to be energized so as to excite therein first and second orthogonal resonant modes, one of said modes being a desired mode, said capacitive elements in segments carrying negligible current in the desired mode being replaced by open circuits so as to displace the frequency of the undesired mode relative to the frequency of the desired mode.

44. The NMR RF coil of claim 43 wherein one of said end caps comprises an annulus.

45. The NMR RF coil of claim 44 wherein said coil comprises a head coil and wherein said conductive end cap and segments are mounted on a substantially cylindrical coil form, which form is provided with a window in the region where said segments have been replaced by open circuits.

46. The NMR RF coil of claim 38 wherein said means comprises first and second means disposed on first and second segments, respectively, separated by an angle $\theta = 90°$.

47. The NMR RF coil of claim 46 wherein at least one of said first and second means each comprises a plurality of series-connected capacitive elements, the common points between said series-connected capacitive elements being selectable to adjust the input impedance of said RF coil.

48. The NMR RF coil of claim 38 wherein said means comprises a plurality of series-connected capacitive elements, the common points between said series-connected capacitive elements being selectable to adjust the input impedance of said RF coil.

49. The NMR RF coil of claim 36 or 38 wherein at least one of said end-cap elements includes a capacitive element having a constant capacitance per unit length in a direction substantially orthogonal to the direction of current flow in said end cap.

50. The NMR RF coil of claim 49 further comprising means for energizing said RF coil across said capacitive element having a constant capacitance per unit length.

51. The NMR RF coil of claim 36 or 38 further comprising at least one conductive loop element spaced apart from one of said end-cap elements above, a common longitudinal axis, said conductive segments electrically interconnecting the one of said end-cap elements and said loop element, the other one of said end-cap elements being substantially coplanar with and having a common center point with said loop element but being electrically insulated therefrom.

52. An NMR radio frequency (RF) coil comprising:
   a first assembly having a plurality of conductive segments, each of said segments having at least one non-conductive gap formed therein; and
   a second assembly, substantially identical to said first assembly, in which the gaps formed in the conductive segments are offset relative to the gaps in said first assembly;
   said first and second assemblies being disposed coaxially relative to one another and being separated by a dielectric material, the conductive segments of each assembly being electrically interconnected at one of the ends thereof to a conductive end-cap element and at the other end thereof to a second conductive end-cap element, the gaps in each assembly being situated such that a gap in one assembly is bridged by a continuous portion of a corresponding segment in the other assembly so as to form a capacitive element.

53. The NMR RF coil of claim 52 wherein at least one of said end caps has a plurality of apertures formed therein, each aperture having a relatively small area compared to the area of said end caps.

54. The NMR RF coil of claim 52 wherein each of said end caps comprises two conductive halves separated by a non-conductive region, which region is oriented substantially parallel to the direction of current flow in said end caps.

55. The NMR RF coil of claim 52 wherein the conductive segments in at least one of said first and second assemblies includes at least one electrically insulated conductive pad in the region of the nonconductive gap, said pad being electrically connectable to the remainder of the conductive segment to vary the area of overlap between corresponding segments of said first and second assemblies so as to adjust the capacitance of said capacitive element.

56. The NMR RF coil of claim 52 wherein said first and second assemblies comprise conductive patterns corresponding to said segment elements fabricated on opposite sides of a printed circuit board.

57. The NMR RF coil of claim 52 wherein said first and second assemblies comprise conductive patterns corresponding to said segment elements fabricated on opposite sides of a single printed circuit board.

58. The NMR RF coil of claim 57 wherein said first and second assemblies each comprise a plurality of subassemblies, each subassembly having fabricated thereon a fraction of the conductive pattern associated with one of said assemblies.

59. The NMR RF coil of claim 52 including means allowing said coil to be energized across at least one of said capacitive elements in one of said conductive segments to achieve in operation a current in said segments approximating a sinusoidal distribution dependent on the segment angular position $\theta$ along the loop peripheries.

60. The NMR RF coil of claim 59 wherein said capacitive elements in segments positioned along the end-cap peripheries where said sinusoidal current distribution approximates a minimum magnitude comprise a short circuit.

61. The NMR RF coil of claim 59 wherein said capacitive elements in segments positioned along the end-cap peripheries where said sinusoidal current distribution approximates a minimum magnitude comprise an open circuit.

62. The NMR RF coil of claim 61 wherein one of said end-cap elements comprises an annulus.

63. The NMR RF coil of claim 62 wherein said coil comprises a head coil and wherein said segments are mounted on a substantially cylindrical coil form, which form is provided with a window in the region where said segments have been replaced by open circuits.

64. The NMR RF coil of claim 59 wherein said means comprises first and second means disposed on first and second segments, respectively, separated by an angle $\theta = 90°$.

65. The NMR RF coil of claim 64 wherein said first and second means each comprise a plurality of series-connected capacitive elements, the common points between said series-connected capacitive elements being selectable to adjust the input impedance of said RF coil.

66. The NMR RF coil of claim 59 wherein said means comprises a plurality of series-connected capacitive elements, the common points between said series-connected capacitive elements being selectable to adjust the input impedance of said RF coil.

67. The NMR RF coil of claim 52 wherein said conductive segments are spaced at equal intervals along the periphery of each of said end-cap elements.

68. The NMR RF coil of claim 67 wherein said segments are spaced along the periphery of each of said loops to form a configuration having four-fold symmetry.

69. The NMR RF coil of claim 67 wherein said segments are spaced along the periphery of each of said end-cap elements to form a configuration having not-fourfold symmetry.

70. The NMR RF coil of claim 52 wherein at least one of said end-cap elements includes a capacitive element having a constant capacitance per unit length in a direction substantially orthogonal to the direction of current flow in said end cap.

71. The NMR RF coil of claim 70 further comprising means for energizing said RF coil across said capacitive element having a constant capacitance per unit length.

72. The NMR RF coil of claim 28 wherein said coil comprises a head coil and wherein said conductive end caps and segments are mounted on a substantially cylindrical coil form, which form is provided with a window in the region where said segments have been replaced by open circuits.

* * * * *